(12) United States Patent
Shin

(10) Patent No.: US 7,511,309 B2
(45) Date of Patent: Mar. 31, 2009

(54) ORGANIC LIGHT EMITTING DISPLAY DEVICE AND METHOD OF FABRICATING THE SAME

(75) Inventor: Hyun-Eok Shin, Suwon-si (KR)

(73) Assignee: Samsung Mobile Display Co., Ltd., Suwon (KR)

( * ) Notice: Subject to any disclaimer, the term of this patent is extended or adjusted under 35 U.S.C. 154(b) by 366 days.

(21) Appl. No.: 11/380,464

(22) Filed: Apr. 27, 2006

(65) Prior Publication Data

US 2006/0243976 A1 Nov. 2, 2006

(30) Foreign Application Priority Data

Apr. 28, 2005 (KR) ............... 10-2005-0035729

(51) Int. Cl.
*H01L 29/34* (2006.01)

(52) U.S. Cl. .................... 257/83; 257/E33.064

(58) Field of Classification Search .......... 257/83, 257/E33.064

See application file for complete search history.

(56) References Cited

FOREIGN PATENT DOCUMENTS

| CN | 1446941 | 10/2003 |
|---|---|---|
| CN | 1575057 | 2/2005 |
| KR | 1020030077963 | 10/2003 |

OTHER PUBLICATIONS

Chinese Office Action dated Apr. 4, 2008.

*Primary Examiner*—Evan Pert
*Assistant Examiner*—Krista Soderholm
(74) *Attorney, Agent, or Firm*—H.C. Park & Associates, PLC

(57) ABSTRACT

An organic light emitting display device and a method of fabricating the same are provided, which employ an Ag alloy containing Sm, Tb, Au, and Cu to simultaneously form a source electrode, a drain electrode, and a first electrode of the organic light emitting display device for increasing the reflectivity and efficiency of the organic light emitting display device and reducing the organic light emitting display device panel size by reducing a line width of the source and drain electrodes due to the low resistance of the source and drain electrodes.

6 Claims, 2 Drawing Sheets

ORGANIC LIGHT EMITTING DISPLAY DEVICE AND METHOD OF FABRICATING THE SAME

CROSS-REFERENCE TO RELATED APPLICATIONS

This application claims priority to and benefit of Korean Patent Application No. 10-2005-0035729, filed Apr. 28, 2005, which is hereby incorporated by reference for all purposes as if fully set forth herein.

BACKGROUND OF THE INVENTION

1. Field of the Invention

The present invention relates to an organic light emitting display device and a method of fabricating the same, and more particularly, to an organic light emitting display device including a first electrode, a source electrode, and a drain electrode simultaneously formed from a silver (Ag) alloy containing samarium (Sm), terbium (Tb), gold (Au), and copper (Cu), and a method of fabricating the same.

2. Description of the Related Art

The advantages of a conventional organic light emitting display device include: low power consumption, wide viewing angle, good contrast, and fast response speed.

FIG. 1 is a cross-sectional view of a conventional top emission active matrix organic light emitting display device and a method of fabricating the same.

Referring to FIG. 1, in accordance with the conventional top emission active matrix organic light emitting display device, a buffer layer 101 is arranged on a substrate 100, and a semiconductor layer 110 including a source region 111, a drain region 112, and a channel region 113 is arranged on the buffer layer 101 in a transistor region (a).

A gate insulating layer 120 is arranged on a surface of the semiconductor layer 110, and a gate electrode 130 corresponding to the channel region 113 of the semiconductor layer 110 is arranged on the gate insulating layer 120.

An interlayer insulating layer 140 is arranged on a surface of the gate electrode 130. A source electrode 150 is electrically coupled with the source region 111 of the semiconductor layer 110 through a contact hole 141 arranged in the interlayer insulating layer 140, and a drain electrode 155 is electrically coupled with the drain region 112 of the semiconductor layer 110 through a contact hole 142 arranged in the interlayer insulating layer 140, thereby forming a thin film transistor.

For decreasing interconnection resistance, the source electrode 150 and the drain electrode 155 are formed of a low-resistance, multi-layered material, where the multi-layered material may be comprised of Al and MoW or Ti, or an Al alloy. The multi-layered material typically has a tri-layered structure of MoW/Al/MoW, MoW/Al—Nd/MoW, Ti/Al—Nd/Ti, or Ti/Al/Ti. The multi-layered material structure of MoW/Al/MoW is mostly commonly used.

MoW may have a specific resistance of 14 μΩ-cm to 15 μΩ-cm, and the source electrode 150 and the drain electrode 155 may have a line width of 6 μm.

The source electrode 150 and the drain electrode 155 may have a thickness of 4,000 Å to 6,000 Å, In this case, MoW or Ti of the source electrode 150 and the drain electrode 155 may have a thickness of 500 Å to 1,000 Å, and Al or Al—Nd may have a thickness of 3,500 Å to 5,000 Å.

At the time of forming the source electrode 150 and the drain electrode 155, a first electrode 160, which is electrically coupled with any one of the source electrode 150 and the drain electrode 155, is arranged on the same layer in an opening region.

The first electrode 160 includes a transparent conductive layer 160b and a reflective layer 160a, such as an Al or an Ag alloy among metals having high reflectivity, and patterned after deposition.

The first electrode 160 may have a thickness of 750□ to 1,300 Å. The reflective layer 160b may have a thickness of 700 Å to 1,200 Å; and the transparent conductive layer 160a, such as an Indium Tin Oxide (ITO) or an Indium Zinc Oxide (IZO), may have a thickness of 50 Å to 100 Å.

Subsequently, a pixel defining layer 180, which has an opening (b) and defines the unit pixel, is arranged on the surface of the substrate 100, including the first electrode 160 and an organic layer 180; the organic layer 180 including at least an organic emission layer arranged on the first electrode 160, exposed within the opening (b).

Subsequently, a second electrode 190 is arranged on the surface of the substrate 100 including the organic layer 180. The second electrode, which is a metal having a low work function, is formed of a thin transmissive electrode comprised of a material selected from the group consisting of Mg, Al, Ag, Ca, and an alloy thereof.

In the conventional active matrix organic light emitting display device of FIG. 1, Ag (1.61 μΩ-cm), used in the formation of the source electrode 150 and the drain electrode 155, is considered as an ideal, low-resistance interconnection material because of its low resistivity; however in manufacturing processes, the use of Ag has been limited because of Ag's weak adhesion, thermal instability, and poor chemical resistant property.

Accordingly, the source electrode 150 and the drain electrode 155 are formed from MoW, Al, or an Al alloy, and Ti instead of Ag, where MoW, Al, or the Al alloy, and Ti are typically used in a stacked structure having at least two material layers. Korean Patent Publication No. 2003-0077963 ('963) discloses an alternative method of depositing the source electrode 150 and the drain electrode 155 using a single material, which employs an Ag alloy layer using an Ag alloy target containing 0.1 to 0.5 atom % of any one of Sm, dysprosium (Dy) and Tb, and 0.1 to 1.0 atom % of Au and/or Cu. A single layer generally cannot be implemented because a step coverage or a hill-look problem causes a disconnection failure or affects a subsequent lithography process due to a change in reflectance. Accordingly, multi-layered materials, preferably having at least two layers, should be employed. However, use of multi-layered materials may cause the number of processes to increase, mass productivity to be lowered, and the electrical efficiency of the thin film transistor to be lowered because the specific resistance may be 5 μΩ-cm or higher.

The Ag alloy layer, as disclosed in '963, may provide adhesion, thermal resistance, corrosion resistance, and/or excellent patterning properties, while maintaining a low resistance property and a high reflectance property; however, when the amount of Sm, Dy, or Tb exceeds 0.5 atom %, the electrical resistance of the Ag alloy layer increases more than 4 μΩ-cm, decreasing the reflectivity of the material. The properties of the aforementioned Ag alloy layered material were determined at temperatures of 250° C. or less. Physical properties for the Ag alloy layered material have not been verified for a thin film transistor at temperatures above 250° C.

When the conventional first electrode is formed as a reflective electrode, Ag, which has the highest reflectivity among metals, has been significantly limited in its use due to adhesion, thermal resistance, and chemical resistance. To address Ag's material limitations, Al and an Al alloy were employed instead of Ag; however, use of Al or the Al alloy, caused the reflectivity and the efficiency to degrade.

SUMMARY OF THE INVENTION

The present invention provides an organic light emitting display device and a method of fabricating the same, which employs an Ag alloy containing Sm, Tb, Au, and Cu for simultaneously forming source and drain electrodes and a first electrode, increasing the reflectivity and efficiency of the organic light emitting display device and reducing the organic light emitting display device panel size by reducing a line width of the source and drain electrodes due to the low resistance of the source and drain electrodes.

Additional features of the invention will be set forth in the description which follows, and in part will be apparent from the description, or may be learned by practice of the invention.

The present invention discloses an organic light emitting display device including: a substrate; a thin film transistor, comprising a semiconductor layer, a gate electrode, a source electrode, and a drain electrode; and a first electrode electrically coupled with any one of the source electrode and the drain electrode on the same layer, arranged on the substrate; an organic layer arranged on the first electrode, comprising at least an organic emission layer; and a second electrode arranged on the organic layer, wherein the source electrode, the drain electrode, and the first electrode comprise a reflective layer formed of a silver (Ag) alloy, having a composition ratio of 0.1 to 0.3 atom % of samarium (Sm), 0.1 to 0.5 atom % of terbium (Tb), 0.1 to 0.4 atom % of gold (Au), and 0.4 to 1.0 atom % of copper (Cu), below a transparent conductive layer.

The present invention also discloses a method of fabricating an organic light emitting display device including: preparing a substrate; forming a thin film transistor, comprising a semiconductor layer, a gate electrode, a source electrode, and a drain electrode; and a first electrode electrically coupled with any one of the source electrode and the drain electrode on the same layer, on the substrate; forming an organic layer, comprising at least an organic emission layer on the first electrode; and forming a second electrode on the organic layer, wherein the source electrode, the drain electrode, and the first electrode are formed of a reflective layer made of a silver (Ag) alloy having a composition ratio 0.1 to 0.3 atom % of Sm, 0.1 to 0.5 atom % of Tb, 0.1 to 0.4 atom % of Au, and 0.4 to 1.0 atom % of Cu, below a transparent conductive layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Figure 1:
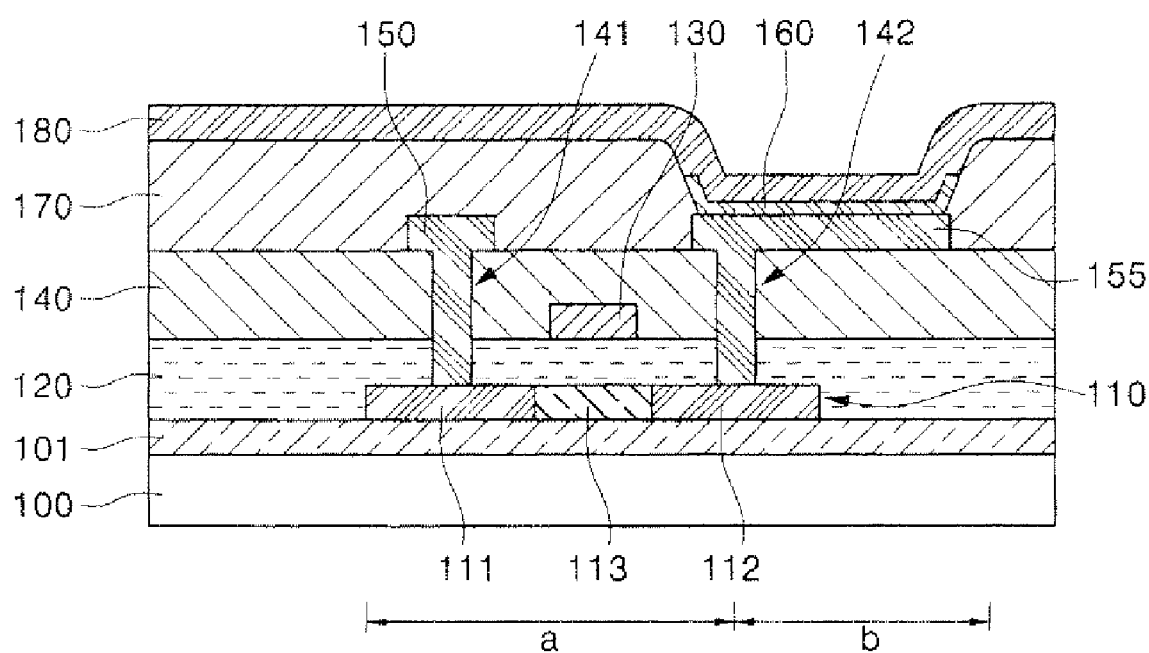
FIG. 1 is a cross-sectional view of a conventional top emission active matrix organic light emitting display device.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative size of layers and regions may be exaggerated for clarity.

It will be understood that when an element such as a layer, film, region or substrate is referred to as being "on" another element, it can be directly on the other element or intervening elements may also be present. In contrast, when an element is referred to as being "directly on" another element, there are no intervening elements present.

Figure 2:
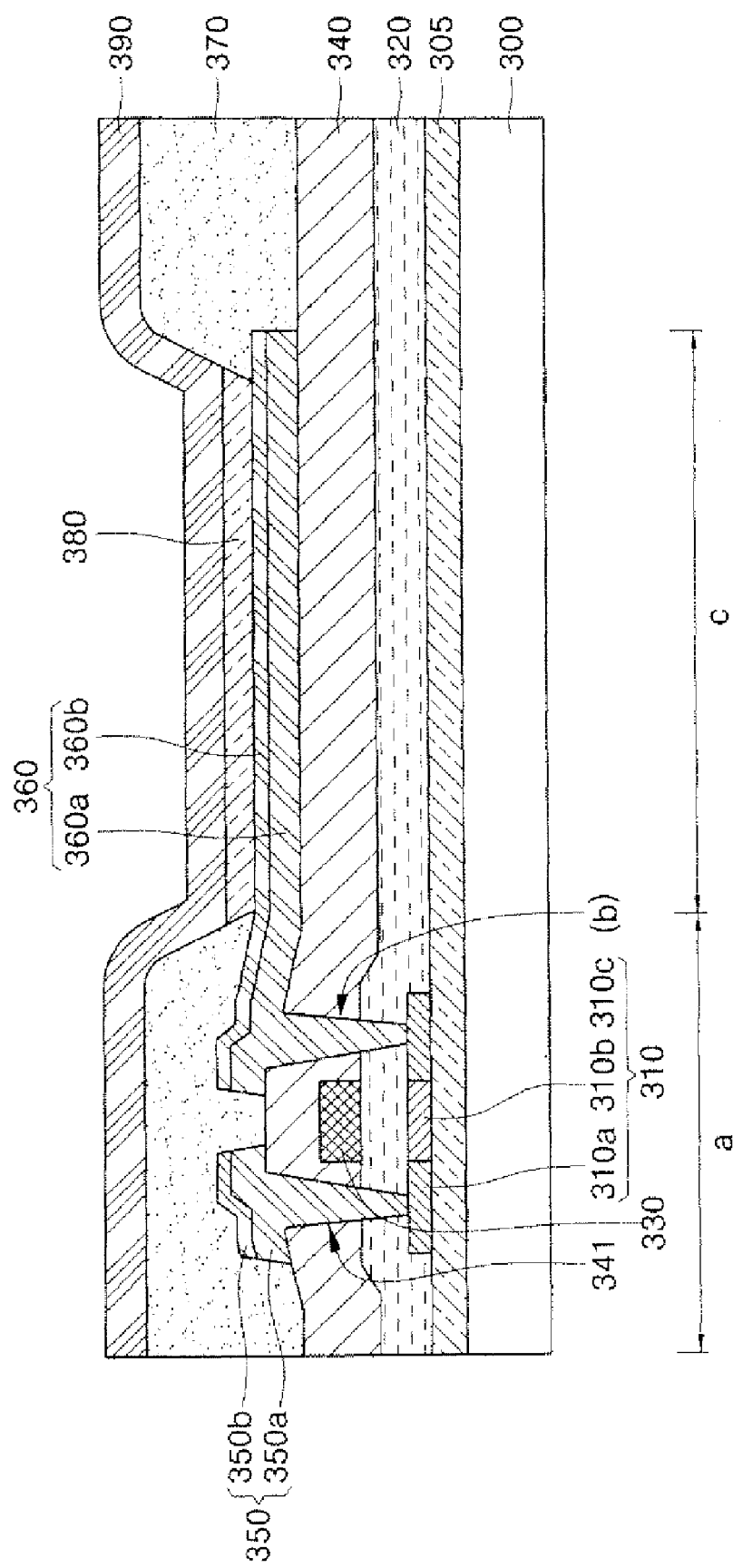
FIG. 2 is a cross-sectional view of a top emission active matrix organic light emitting display device according to exemplary embodiments of the present invention.

FIG. 2 is a cross-sectional view of a top emission active matrix organic light emitting display device according to exemplary embodiments of the present invention.

Referring to FIG. 2, according to the top emission active matrix organic light emitting display device of the present invention, a buffer layer 305 is arranged on a substrate 300; and a semiconductor layer 310, including a source region 310a, a drain region 310c, and a channel region 310b, is arranged on the buffer layer 305 in a transistor region (a).

A gate insulating layer 320 is arranged on the surface of the semiconductor layer 310, and a gate electrode 330 corresponding to the channel region 310b of the semiconductor layer 310 is arranged on the gate insulating layer 320.

An interlayer insulating layer 340 is arranged on a surface of the gate electrode 330. A source electrode 350 is electrically coupled with the source region 310a of the semiconductor layer 310 through a contact hole 341 arranged in the interlayer insulating layer 340 and the gate insulating layer 320, and a drain electrode 360 is electrically coupled with the drain region 310c of the semiconductor layer 310 through a contact hole 345 arranged in the interlayer insulating layer 340 and the gate insulating layer 320, thereby forming a thin film transistor.

When the source electrode 350 and the drain electrode 360 are formed, the first electrode 360, which functions as a reflective electrode, is formed on the same layer. Reflective layers 350a and 360a, comprised of an Ag alloy containing Sm, Tb, Au, and Cu are arranged below the source electrode 350, the drain electrode 355, and the first electrode 360, respectively. Transparent conductive layers 350b and 360b are arranged on the reflective layers 350a and 360a, respectively.

A composition ratio of the Ag alloy is comprised of 0.1 to 0.3 atom % of Sm, 0.1 to 0.5 atom % of Tb, 0.1 to 0.4 atom % of Au, and 0.4 to 1.0 atom % of Cu.

The Ag alloy has an atomic radius similar to the atomic radius of elemental Ag, facilitates electron reduction because of its oxyphile property, and contains two rare earth elements such as Sm and Tb having superior activity of free electrons and elements, or such as Au and Cu, having solid solution properties and preventing diffusion of Ag elements. The Ag alloy has low resistance, high reflectivity, high corrosion resistance, high thermal resistance, high adhesion, and excellent patterning properties. The addition of the two rare earth metals to the Ag alloy allows the Ag alloy to be used at a temperature of 450° C. High specific resistance, characteristic of the conventional Ag alloy, may be reduced by forming the Ag alloy with a thickness of 500 Å to 7,000 Å.

In accordance with an embodiment of the present invention, the thickness of the source electrode 350 and the drain electrode 360 may be in a range of 750 Å to 1,300 Å. The reflective layers 350*a* and 360*a*, composed of the Ag alloy, may be formed to a thickness of 700 Å to 1,200 Å, and the transparent conductive layers 350*b* and 360*b* may be formed to a thickness of 50 Å to 100 Å.

When the thickness is less than 700 Å, a failure in interconnection resistance or a disconnection failure may occur when applying a voltage. When the thickness exceeds 1,200 Å, no failures in the device occur; however, the material costs increase.

The reflective layer 350*a* of the source electrode 350 and the reflective layer 360*a* of the drain electrode 360 are preferably formed to a thickness of 1,000 Å. The Ag alloy is preferably formed to a thickness of about 1,000 Å, because the Ag alloy has a specific resistance of 3.0 $\mu\Omega$-cm (after annealing at a temperature of 250° C.), which is about one fifth of the conventional MoW (14 to 15 $\mu\Omega$-cm).

In addition, the source electrode 350 and the drain electrode 360, composed of the Ag alloy, are each formed with a width of 2 $\mu$m to 3 $\mu$m because the Ag alloy has a specific resistance of 3.0 $\mu\Omega$-cm (after annealing at a temperature of 250° C.), which is about one fifth of the conventional MoW (14 to 15 $\mu\Omega$-cm).

When the width of the source electrode 350 and the drain electrode 360 is less than 2 $\mu$m, resistance may increase disturbing a smooth voltage supply, and when the width exceeds 3 $\mu$m, the panel size may increase due to presence of dead space.

Accordingly, the present invention allows the width of the source electrode 350 and the drain electrode 360 to decrease from the conventional width of 6 $\mu$m to 2 $\mu$m to 3 $\mu$m, allowing the panel size to be compacted.

The first electrode 360, which is electrically coupled with any one of the source electrode 350 and the drain electrode 360, is simultaneously formed from the Ag alloy in the opening region (b) with the formation of the source electrode 350 and the drain electrode 360, and extends into the opening region (b), where the first electrode 360 functions as a reflective electrode.

Generally, the first electrode 360 is formed of a reflective layer 360*a*, such as an Al or an Al alloy having high reflectivity in its lower layer, and a transparent conductive layer 360*b*, such as an ITO or an IZO, arranged on the reflective layer.

Preferably, the first electrode 360 is formed as a reflective electrode, including the transparent conductive layer 360*b* arranged on the reflective layer 360*a*, which is composed of the same Ag alloy used to form the source electrode 350 and the drain electrode 360.

The first electrode 360 is formed to a thickness of 750 Å to 1,300 Å.

The reflective layer 360*a* is formed to a thickness of 700 Å to 1,200 Å. When the thickness is less than 750 Å, a failure in interconnection resistance or a disconnection failure may occur when applying a voltage due to high resistance. When the thickness exceeds 1,200 Å, no failures occur; however, the material costs increase.

The first electrode 360 is preferably formed to a thickness of about 1,000 Å, because the Ag alloy has a specific resistance of 3.0 $\mu\Omega$-cm (after annealing at a temperature of 250□) which is about one fifth of the conventional MoW (14 to 15 $\mu\Omega$-cm).

In addition, the transparent conductive layer 360*b* formed on the reflective layer 360*a* is formed from one material selected from the group consisting of ITO and IZO.

The transparent conductive layer 360*b* is formed to a thickness of 50 Å to 100 Å for compensating color coordinates using an optical path and for compensating a work function.

Subsequently, a pixel defining layer 370, which defines the unit pixel and has an opening (c), is arranged on the surface of the substrate 300, including the first electrode 360, and an organic layer 380 including at least an organic emission layer arranged on the first electrode 360, exposed within the opening (c).

Subsequently, a second electrode 390 is arranged on the surface of the substrate 300 including the organic layer 380. The second electrode 390, which has a low work function, is formed of a thin transmissive electrode using a material comprised of a material selected from the group consisting of Mg, Al, Ag, Ca, and an alloy thereof, and allows light to be transmitted.

The substrate 300 having the second electrode 390 and the previously formed elements may be encapsulated with a top substrate using a typical encapsulation method, thereby completing the fabrication of the top emission active matrix organic light emitting display device.

Hereinafter, a method of fabricating the top emission active matrix organic light emitting display device according to the present invention will be described in detail.

Referring to FIG. 2, according to the top emission active matrix organic light emitting display device of the present invention, a transparent substrate 300, such as glass, plastic, or quartz is prepared; and a buffer layer 305 is arranged on the substrate 300. The buffer layer 305 arranged on the substrate 300 protects a thin film transistor to be formed in a subsequent process from impurities flowing out of the substrate 300.

The buffer layer 305 is not necessarily stacked, and may be formed of a silicon oxide layer, a silicon nitride layer, or a stacked layer thereof. The buffer layer 305 may be deposited by a plasma enhanced chemical vapor deposition (PECVD) method or a low pressure CVD (LPCVD) method.

Subsequently, semiconductor layer 310, including a source region 310*a*, a drain region 310*c*, and a channel region 310*b*, which is interposed between the source region 310*a* and the drain region 310*c*, is patterned on the buffer layer 305 in the transistor region (a). The semiconductor layer 310 may be formed of amorphous silicon or polycrystalline silicon, and is preferably formed of polycrystalline silicon. When the semiconductor layer 310 is formed of the amorphous silicon, it is crystallized into the polycrystalline silicon by a crystallization method after it is deposited. When the amorphous silicon is processed using the PECVD method, a dehydrogenation process performed by thermal treatment after depositing a silicon layer is carried out to decrease a concentration of hydrogen. The method of crystallizing the amorphous silicon layer may employ at least one of a rapid thermal annealing (RTA) process, a solid phase crystallization (SPC) method, an excimer laser crystallization (ELA) method, a metal induced crystallization (MIC) method, a metal induced lateral crystallization (MILC) method, and a sequential lateral solidification (SLS) method.

Subsequently, a gate insulating layer 320 is arranged on the surface of the substrate including the semiconductor layer 310. The gate insulating layer 320 may be formed of a silicon oxide layer, a silicon nitride layer, or a stacked layer thereof, and may be deposited using PECVD or LPCVD.

Subsequently, a gate electrode 330 is arranged on the gate insulating layer 320 corresponding to the channel region 310*b* of the semiconductor layer 310. The gate electrode 330 may be formed of a polysilicon layer made of amorphous silicon or polycrystalline silicon, or may be formed of one material selected from the group consisting of molybdenum (Mo), tungsten (W), tungsten molybdenum (MoW), and tungsten silicide (Wsix). The gate electrode 330 is deposited using a sputtering or evaporation method.

Subsequently, impurities are implanted into the semiconductor layer 310 using a mask to form a source region 310a and a drain region 310c in the semiconductor layer 310, while defining a channel region 310b interposed between the source regions 310a and the drain region 310c. The impurities may be an n-type or a p-type. The n-type impurities are formed of one material selected from the group consisting of phosphor (P), arsenic (As), antimony (Sb), and bismuth (Bi); and the p-type impurities are formed of one material selected from the group consisting of boron (B), aluminum (Al), gallium (Ga), and indium (In).

Subsequently, an interlayer insulating layer 340 is arranged on the surface of the substrate including the gate electrode 330. The interlayer insulating layer 340 may be formed of a silicon oxide layer, a silicon nitride layer, or a stacked layer thereof, and may be deposited by PECVD or LPCVD.

Subsequently, contact holes 341 and 345 are arranged within the interlayer insulating layer 340 and the gate insulating layer 320 for exposing the source region 310a and the drain region 310c, respectively. An Ag alloy arranged on the interlayer insulating layer 340, composed of a composition ratio of 0.1 to 0.3 atom % of Sm, 0.1 to 0.5 atom % of Tb, 0.1 to 0.4 atom % of Au, and 0.4 to 1.0 atom % of Cu, may be deposited using a sputtering or evaporation method.

Transparent conductive layers 350b and 360b, formed of ITO or IZO, are stacked on reflective layers 350a and 360a, formed of the Ag alloy, respectively, using a sputtering or evaporation method, thereby forming the source electrode 350, the drain electrode 360, and the first electrode 360.

The source electrode 350, the drain electrode 360, and the first electrode 360 are preferably deposited using a sputtering method, and patterned by means of an etch process using a mask, such as a photoresist (PR) pattern formed in a lithography process after the deposition.

Accordingly, the semiconductor layer 310, the gate electrode 330, the source electrode 350, and the drain electrode 360 constitute a thin film transistor.

The first electrode 360, which is arranged on the same layer as and electrically coupled with any one of the source electrode 350 and the drain electrode 360, is simultaneously formed from the Ag alloy in the opening region (b) with the formation of the source electrode 350 and the drain electrode 360, where the first electrode 360 functions as a reflective electrode.

The first electrode 360 is formed of an Ag alloy, which is the same material used in the formation of the source electrode 350 and the drain electrode 360; the Ag alloy comprised of a composition ratio of 0.1 to 0.3 atom % of Sm, 0.1 to 0.5 atom % of Tb, 0.1 to 0.4 atom % of Au, and 0.4 to 1.0 atom % of Cu.

When the first electrode 360 is formed of the Ag alloy, reflectivity increases by 10% or more, which increases the efficiency by approximately 20% in comparison to the efficiency of a conventional reflective electrode formed from Al or Al—Nd.

The process of depositing and patterning the first electrode 360 can be eliminated because the source electrode 350, the drain electrode 360, and the first electrode 360 are simultaneously formed.

Subsequently, a pixel defining layer 370, which defines the pixel region, is further formed of an insulating material and arranged on the first electrode 360 for insulating the first electrode from an organic emission layer. An etching method using a PR mask is then carried out to form an opening (c) for exposing a portion of the first electrode 360.

Subsequently, an organic layer 380 including at least the organic emission layer is arranged on the first electrode 360, exposed within the opening (c).

A small moleculer weight material or a polymer material may be employed for forming the organic emission layer. The small moleculer weight material is preferably one material selected from the group consisting of tris(8-hydroxyquinoline)aluminum (Alq3), antrhacene, cyclo pentadiene, BeBq2, Alq3, Almq, ZnPBO, Balq, DPVBi, BSA-2, and 2PSP. Preferably, the organic emission layer is formed of Alq3. The polymer material is preferably one material selected from the group consisting of polyphenylene (PPP) and its derivative, poly(p-phenylenevinylene) (PPV) and its derivative, and polythiophene (PT) and its derivative.

The organic layer 380 may further include at least one of a hole injection layer (HIL), a hole transport layer (HTL), an electron transport layer (ETL), and an electron injection layer (EIL).

Conventional materials may be employed for the formation of the HIL, HTL, ETL, and EIL. For example, the HIL may employ copper phthalocyanine (CuPc), poly(3,4-ehtylene-dixoythiophene) (PEDOT), and tris[4-[N-(3-methylphenly) aniline]phenyl]amine) (m-MTDATA); the HTL may employ a third aromatic amine-based material such as mono arylamine, diarylamine, triarylamine, polymerization arylamine; the ETL may employ polycyclic hydro carbon-based derivatives, heterocyclic compound, and Alq3; and the EIL may employ a material such as lithium fluoride (LiF).

The organic layer 380 may be formed using an evaporation method, a spin coating method, an inkjet printing method, or a laser induced thermal imaging method. Preferably, the organic layer 380 is formed using the spin coating method. In addition, patterning the organic layer 380 may be implemented by a laser induced thermal imaging method or an evaporation method using a shadow mask.

Subsequently, a second electrode 390 is arranged on the organic layer 380 over the entire surface of the substrate 300. The second electrode 390 may be formed by a typical method, such as the evaporation method.

Accordingly, the substrate 300 having the second electrode 390 and the previously formed elements is encapsulated with a top substrate using a typical encapsulation method, thereby completing the fabrication of the top emission active matrix organic light emitting display device.

Hereinafter, one embodiment of the present invention will be described. However, the embodiment is given for an exemplary purpose to better understand the present invention, and the present invention is not limited to the embodiment described below.

First Embodiment

The source electrode 350 and the drain electrode 355 of the organic light emitting device were formed from an Ag alloy (a composition ratio of 0.3 atom % of Sm, 0.5 atom % of Tb, 0.4 atom % of Tb, and 0.4 to 1.0 atom % of Cu) having a thickness of 5000□ using a sputtering method. The remaining elements of the thin film transistor would have been identified as conventional elements for a thin film transistor to one of ordinary skill in the art.

FIRST COMPARATIVE EXAMPLE

The source electrode 350 and the drain electrode 360 of the organic light emitting device were formed using the same method as disclosed in the first embodiment above; however, the source electrode 350 and the drain electrode 360 were stacked in a tri-layered structure of MoW(thickness of 500 Å)/Al—Nd(thickness of 4,000 Å)/MoW(thickness of 500 Å)).

SECOND COMPARATIVE EXAMPLE

The source electrode 350 and the drain electrode 360 of the organic light emitting device were formed using the same method as disclosed in the first embodiment above; however, the source electrode 350 and the drain electrode 360 were stacked in a tri-layered structure of Ti(thickness of 700 Å)/Al (thickness of 3,800 Å)/MoW(thickness of 1,000 Å)).

THIRD COMPARATIVE EXAMPLE

The source electrode 350 and the drain electrode 360 of the organic light emitting device were formed using the same method as disclosed in the first embodiment above; however, the source electrode 350 and the drain electrode 360 were stacked in a tri-layered structure of Ti(thickness of 1,500 Å)/Al(thickness of 3,000 Å)/MoW(thickness of 1,000 Å)).

Table 1 shows results for specific resistance properties in accordance with the first embodiment, and the first, second, and third comparative examples described above.

TABLE 1

| Example | Material Structure of Source and Drain Electrodes | Thickness of each Layer of Source and Drain Electrodes (Å) | Total Thickness of Source and Drain electrodes (Å) | Sheet Resistance (Ω) | Specific Resistance (μΩ-cm) |
|---|---|---|---|---|---|
| First embodiment | Ag alloy | 5000 | 5000 | 0.06 | 3.00 |
| First comparative example | MoW/ Al—Nd/MoW | 500/4000/500 | 5000 | 0.135 | 6.75 |
| Second comparative example | Ti/Al/Ti | 700/3800/1000 | 5500 | 0.167 | 9.19 |
| Third comparative example | Ti/Al/Ti | 1500/3000/1000 | 5500 | 0.213 | 11.72 |

Table 1 illustrates that the specific resistance was 3.0 μΩ-cm when Ag alloy was employed to form the source and drain electrodes of a single layer with thickness of 5,000 Å in the organic light emitting display device of the present invention. The specific resistance was significantly lower than the specific resistances of 6.75 μΩ-cm to 11.72 μΩ-cm for the multi-layered structures using conventional MoW or Ti, and Al or an Al alloy in accordance with the first, second, and third comparative examples.

Accordingly, when the source and drain electrodes are formed from the Ag alloy as a single layer in accordance with the present invention, the specific resistance can decrease by 100% or more compared to the multi-layer structure using the conventional MoW or Ti, and Al or an Al alloy.

Only the source electrode 350, the drain electrode 360, and the first electrode 360 in the organic light emitting device of the present invention are formed from the Ag alloy having a composition ratio of 0.3 atom % of Sm, 0.1 to 0.5 atom % of Tb, 0.4 atom % of Au, and 0.4 to 1.0 atom % of Cu; however, the present invention is not limited to only the formation of these three electrodes. Because of its low resistance, the Ag alloy may be used in the formation of metal interconnections, such as Vdd, Vdata and so forth, of an organic light emitting display device.

According to the present invention as disclosed above, an Ag alloy containing Sm, Tb, Au, and Cu is employed to simultaneously form a source electrode, a drain electrode, and a first electrode, increasing the reflectivity and efficiency of the organic light emitting display device and reducing the organic light emitting display device panel size by reducing a line width of the source and drain electrodes due to the low resistance of the source and drain electrodes.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic light emitting display device comprising:
   a substrate;
   a thin film transistor, comprising a semiconductor layer, a gate electrode, a source electrode, and a drain electrode; and a first electrode electrically coupled with any one of the source electrode and the drain electrode on the same layer, arranged on the substrate;
   an organic layer arranged on the first electrode and including at least an organic emission layer; and
   a second electrode arranged on the organic layer,
   wherein the source electrode, the drain electrode and the first electrode, comprise a reflective layer formed of a silver (Ag) alloy having a composition ratio of 0.1 to 0.3 atom % of samarium (Sm), of 0.1 to 0.5 atom % of terbium (Tb), 0.1 to 0.4 atom % of gold (Au), and 0.4 to 1.0 atom % of copper (Cu), below a transparent conductive layer.

2. The organic light emitting display device of claim 1, wherein the Ag alloy has a resistance of 3 μΩ-cm.

3. The organic light emitting display device of claim 1, wherein the reflective layer has a thickness of 700 Å to 1,200 Å.

4. The organic light emitting display device of claim 1, wherein the transparent conductive layer has a thickness of 50 Å to 100 Å.

5. The organic light emitting display device of claim 1, wherein the source electrode and the drain electrode each has a width of 2 μm to 3 μm.

6. The organic light emitting display device of claim 1, wherein the second electrode is a transmissive electrode formed of one material selected from the group consisting of Mg, Al, Ag, Ca, and an alloy thereof.

* * * * *